United States Patent
Naura et al.

(10) Patent No.: US 6,504,791 B1
(45) Date of Patent: Jan. 7, 2003

(54) METHOD FOR PAGE MODE WRITING IN AN ELECTRICALLY ERASABLE/ PROGRAMMABLE NON-VOLATILE MEMORY AND CORRESPONDING ARCHITECTURE

(75) Inventors: David Naura, Aix en Provence (FR); Sebastien Zink, Aix en Provence (FR); Bertrand Bertrand, Trets (FR)

(73) Assignee: STMicroelectronics S.A., Montrouge (FR)

( * ) Notice: Subject to any disclaimer, the term of this patent is extended or adjusted under 35 U.S.C. 154(b) by 15 days.

(21) Appl. No.: 09/660,303

(22) Filed: Sep. 12, 2000

(30) Foreign Application Priority Data

Sep. 16, 1999 (FR) .............................................. 99 11601

(51) Int. Cl.[7] ................................................. G11C 8/00
(52) U.S. Cl. .............................. 365/238.5; 365/230.03; 365/230.08; 365/239
(58) Field of Search .............................. 365/238.5, 239, 365/230.08, 230.03

(56) References Cited

U.S. PATENT DOCUMENTS

| | | | |
|---|---|---|---|
| 5,105,384 A | * | 4/1992 | Noguchi et al. ......... 365/238.5 |
| 5,214,605 A | * | 5/1993 | Lim et al. .............. 365/189.09 |
| 5,606,532 A | * | 2/1997 | Lambrace et al. ....... 365/238.5 |
| 5,615,149 A | | 3/1997 | Kobayashi et al. ..... 365/185.12 |
| 5,751,637 A | | 5/1998 | Chen et al. ............ 365/185.33 |
| 5,862,099 A | * | 1/1999 | Gannage et al. ........ 365/238.5 |

* cited by examiner

Primary Examiner—Son T. Dinh
(74) Attorney, Agent, or Firm—Lisa K. Jorgenson; Allen, Dyer, Doppelt, Milbrath & Gilchrist, P.A.

(57) ABSTRACT

A method of writing in page mode in an electrically erasable and programmable non-volatile memory includes an initialization phase of writing an information element for the selection of the page in a storage latch associated with a column of the non-volatile memory array, and the writing in a temporary memory of each of the data bits to be written in the page. A write phase includes the selection of rows of the non-volatile memory array according to the contents of the temporary memory. A page mode write circuit includes one latch per column of the non-volatile memory array to contain a page selection information element, and a control logic circuit to give the row selection signals as a function of the contents of the temporary memory in a phase for writing the column of the non-volatile memory array.

29 Claims, 7 Drawing Sheets

METHOD FOR PAGE MODE WRITING IN AN ELECTRICALLY ERASABLE/ PROGRAMMABLE NON-VOLATILE MEMORY AND CORRESPONDING ARCHITECTURE

FIELD OF THE INVENTION

The present invention relates to integrated circuits, and, more particularly, to a method of page mode writing in an electrically erasable and programmable memory in which several words can be written in memory in a single access operation. The present invention also relates to an architecture corresponding to this method. The present invention may be applied especially to EEPROM type memories, and more generally, to memories offering a method of writing in the page mode.

BACKGROUND OF THE INVENTION

Commonly used memory architectures provide for reading or writing of information encoded using several bits, e.g., bytes (eight bits), for forming information words. In this case, the memory array is organized in columns. Each column groups eight bit lines Bl0–Bl7 together. Thus, it is possible to simultaneously access eight memory cells located on the same row that contain corresponding information bits D0–D7. All the cells of the same column are connected to a source line.

The selection of a given memory cell requires the application of appropriate levels of voltage to a row, column, bit line and source line depending on the operation to be performed on the memory cell. The operation may be a read, erase (writing of a 1) or programming (writing of a 0) operation. A programming operation requires a preliminary erase operation. Depending on the acess specifications to the memory, a design engineer has several architecture possibilities to choose from. A well-known exemplary architecture is illustrated in FIG. 1.

In this example, the memory array is organized in p+1 rows Wl0 to Wlp, and m+1 columns Col0 to Colm. For each of these columns, there are associated eight bit lines Bl0 to Bl7 therewith. Each word in the memory has eight cells C0, ..., C7 placed in the same row.

The memory word M0 corresponding to the row Wl0 and the column Col0 is illustrated in detail in FIG. 1. There are eight memory cells C0 to C7. Each of the cells has an access transistor Ta series-connected with a floating-gate transistor Tf. The access transistor Ta is connected at its gate to the corresponding row Wl0, and at its drain to the corresponding bit line. For example, bit line Bl0 is connected to cell C0.

An additional access transistor Tc0,0 has its gate connected to the corresponding row Wl0 and its drain connected to the corresponding column Col0. Its source is connected to the control gate of each of the floating-gate transistors Tf of the cells C0 to C7 of the word considered. Finally, the sources of these transistors Tf are connected together to a source line Sl0 associated with the column Col0. In the example, there is one source line Sl0, ..., Slm per column Col0, ..., Colm of the memory array.

In the invention, special attention is paid to a memory access mode in which the memory can be written in page by page. Each page corresponds to a group of words of the memory. In the prior art, each page corresponds to a row of the memory array. In the example, there are therefore p+1 pages corresponding to the p+1 rows Wl0 to Wlp.

To summarize, in page mode, it is sufficient for a user to present the address of the page to be written on the external address bus, and then successively present all the data to be written on the external data bus of the memory circuit. Specific internal circuits of the memory circuit then perform the sequencing operations needed to erase and program the memory cells of the addressed page.

In particular, these internal circuits comprise a temporary memory to store the data to be written. The elements of this temporary memory are generally bistable circuits, and are also known as latches. The page mode write circuit thus requires at least as many latches as there are data bits to be written in a page, and additional circuits to apply appropriate levels of voltage to the cells depending on the contents of these latches. The erasure and programming operations require the use of a high voltage applied appropriately to one or more of the access lines to the cells, especially the bit columns and the bit lines.

In particular, these write circuits have to apply a high voltage to those bit lines of the memory array in which a data element is to be written (erasure operation). The temporary memory must furthermore comprise one additional latch per column, enabling also the application of the high voltage to the columns of the memory. This is necessary to obtain the operation for the erasure of the cells before they are programmed.

For these various reasons, all the elements of the temporary memory are high-voltage type elements by which the high voltage can be switched over to the bit lines and the columns. FIG. 1 thus shows a prior art architecture with the elements affected by the page write mode, especially the temporary memory.

This architecture shows the typical circuits enabling read and write access to the memory. There is thus an address register 1 receiving the address signals A0–AK from the external address bus and giving internal address signals ADRX, ADRY to the different decoding circuits. A data register 2 receives the external input/output data signals D0–D7 from the external data bus. This data register internally delivers data signals Di0–Di7 corresponding to the external data that it receives. It receives output data signals Ds0–Ds7 internally from the read amplifier circuit 3 of the non-volatile memory.

A logic circuit 4 for the general control of the memory appropriately controls the different internal circuit elements. These elements include the row decoder DECX and the associated high-voltage selector switch HVX, the column decoder DECY, the read amplifier circuit 3, the high-voltage Vpp generator HVGEN, the generator of phasing logic signals CLKGEN, and the high-voltage type temporary memory HMT, etc. The logic circuit 4 controls these different circuit elements as a function of the external signals that it receives. These signals include the pack selection control signal /CE, data output enabling signals /OE, and write signals /WE.

To access the array 5 of memory cells, the circuit usually comprises a row decoder DECX to select one row among the rows Wl0–Wlp of the memory array, and a column decoder DECY to select one or more columns Col0–Colm of the memory array. The row decoder provides selection logic signals Row0, ..., Rowp to the high voltage selector switch HVX which, at output, applies the appropriate voltage levels to the rows as a function of the access mode. The column decoder DECY provides selection logic signals Selcol0, ..., Selcolm. These signals are applied to a read gate circuit 8 to connect a group of bit lines Bl0, ..., Bl7 to the read amplifier circuit 3. In the example, these column selection signals are also applied to the temporary memory.

The temporary memory, referenced HMT, can store m+1 words MI0 to MIm corresponding to a page of the memory, namely one information word per column. Each information word MIi comprises an information bit for the selection of the corresponding column, and eight information bits corresponding to the data element to be written. The column selection information bits are given by the column selection signals SelCol0 to SelColm and are output by the column decoder DECY. The eight other information bits are given by the internal data input bus via signals Di0 to Di7. In the example, the temporary memory therefore comprises (9*m+1) high-voltage latches. If m=15, which is typical for a memory having a capacity of 2 kilobytes with 16 rows and 16 columns, there are 144 high-voltage latches.

For writing in the non-volatile memory as a function of the information words previously registered in the latches of the memory HMT, these latches are controlled by a high-voltage control signal CGT given by the phase signals generation circuit CLKGEN. Thus, the programming voltage is applied to all the bit lines. The page mode thus enables the writing of m+1 words of the memory in a period of time equal to only one period needed to write a single memory cell. This is very useful, for example, in applications where a large amount of data has to be written periodically.

However, the high-voltage latches are elements whose physical layout in an integrated circuit uses a lot of space. For example, in a memory circuit with a memory capacity of 2 kilobytes, the high-voltage latches needed to implement the page mode take as much space on the circuit as the memory array itself. This is a major drawback, especially for making low-capacity memory circuits (2 kilobytes) at low cost.

U.S. Pat. No. 5,363,330 discloses an architecture in which the high-voltage latches of the temporary memory are replaced by low-voltage latches, which are less bulky. Writing is done by an appropriate sequencing of high-voltage translators and high-voltage multiplexers. This architecture reduces the amount of space taken up by the memory, but the writing time is appreciably longer.

SUMMARY OF THE INVENTION

In view of the foregoing background, it is therefore an object of the present invention is to reduce the number of high-voltage latches needed to implement the page mode.

This and other objects, features, and advantages in accordance with the present invention are provided by changing the page mode concept. According to the present invention, a page no longer corresponds to a row of the memory, but to a column. This change in the concept of the page mode associated with a temporary memory powered at the logic supply voltage, and no longer at high voltage, achieves the goals of reducing the cost of the concerned memories without excessively penalizing the page mode access time.

A method of writing in page mode in an electrically erasable and programmable non-volatile memory in an integrated circuit is thus provided. The memory comprises a memory array organized in matrix form in columns and rows of memory words. Each memory word comprises a plurality of memory cells. Each memory cell is associated with a bit line, a row decoder and a column decoder respectively providing row selection signals and column selection signals enabling the application of appropriate voltage levels for read access and write access to the memory array. Page mode write means comprises a temporary memory to store data to be written in the page.

The method comprises an initialization phase comprising the writing of an information element for the selection of the page to be written in a storage latch associated with a column of the non-volatile memory array, and the writing in a temporary memory of the data to be written in the page. A write phase comprises selecting rows of the non-volatile memory array as a function of the contents of the temporary memory.

The present invention also relates to an architecture of an electrically erasable and programmable non-volatile memory in an integrated circuit, wherein the page mode write means comprises one latch per column of the non-volatile memory array to contain a page selection information element and a control logic circuit. This provides the row selection signals as a function of the contents of the temporary memory in a step for the writing of the column of the non-volatile memory array.

BRIEF DESCRIPTION OF THE DRAWINGS

Other features and advantages of the present invention are described in the following description of an embodiment made by way of a non-restrictive illustration, with reference to the appended drawings, of which.

DETAILED DESCRIPTION OF THE PREFERRED EMBODIMENTS

Figure 1:
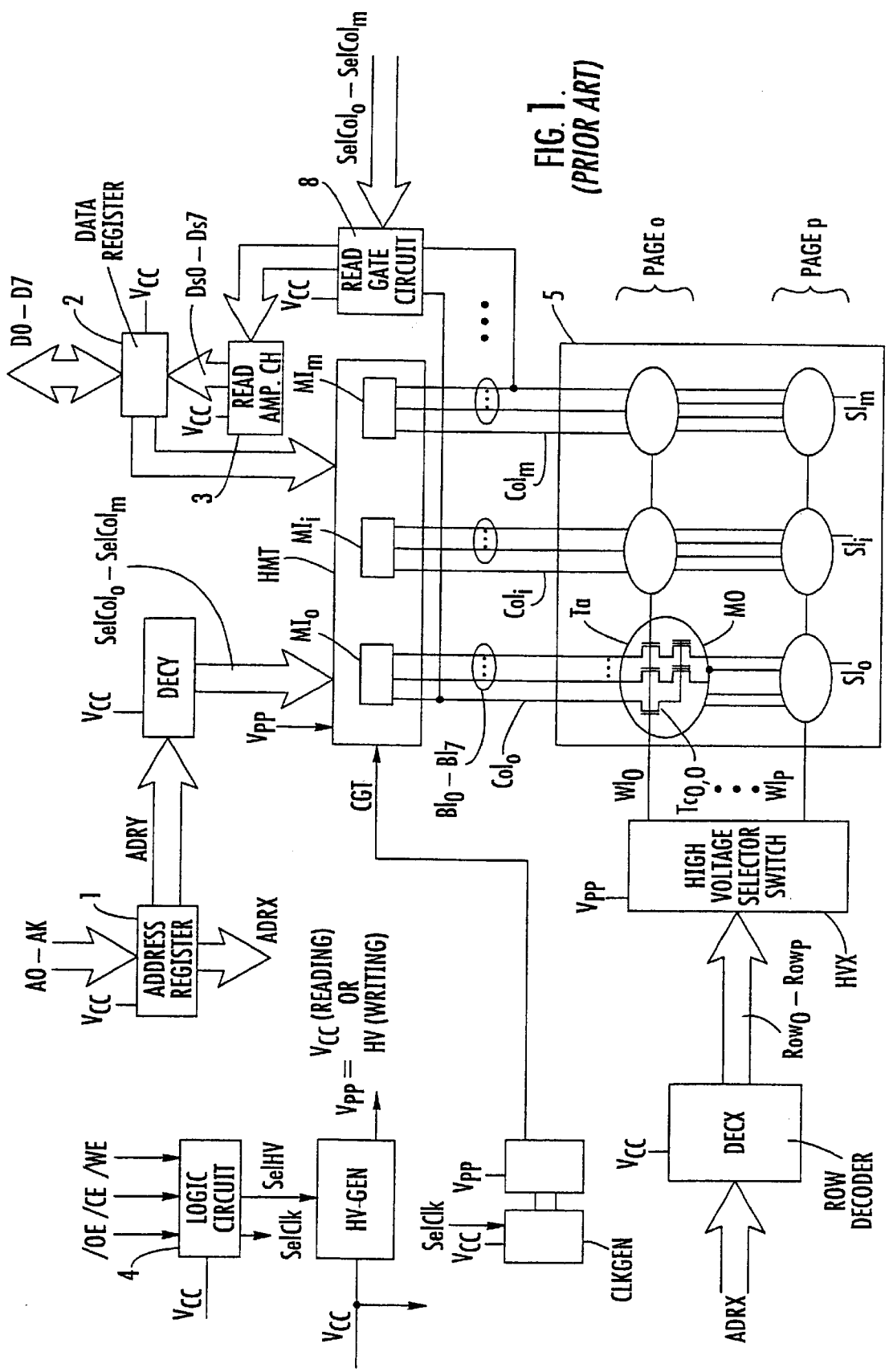
FIG. 1 shows a general block diagram of a EEPROM type memory circuit implementing page mode writing according to the prior art.
Figure 2:
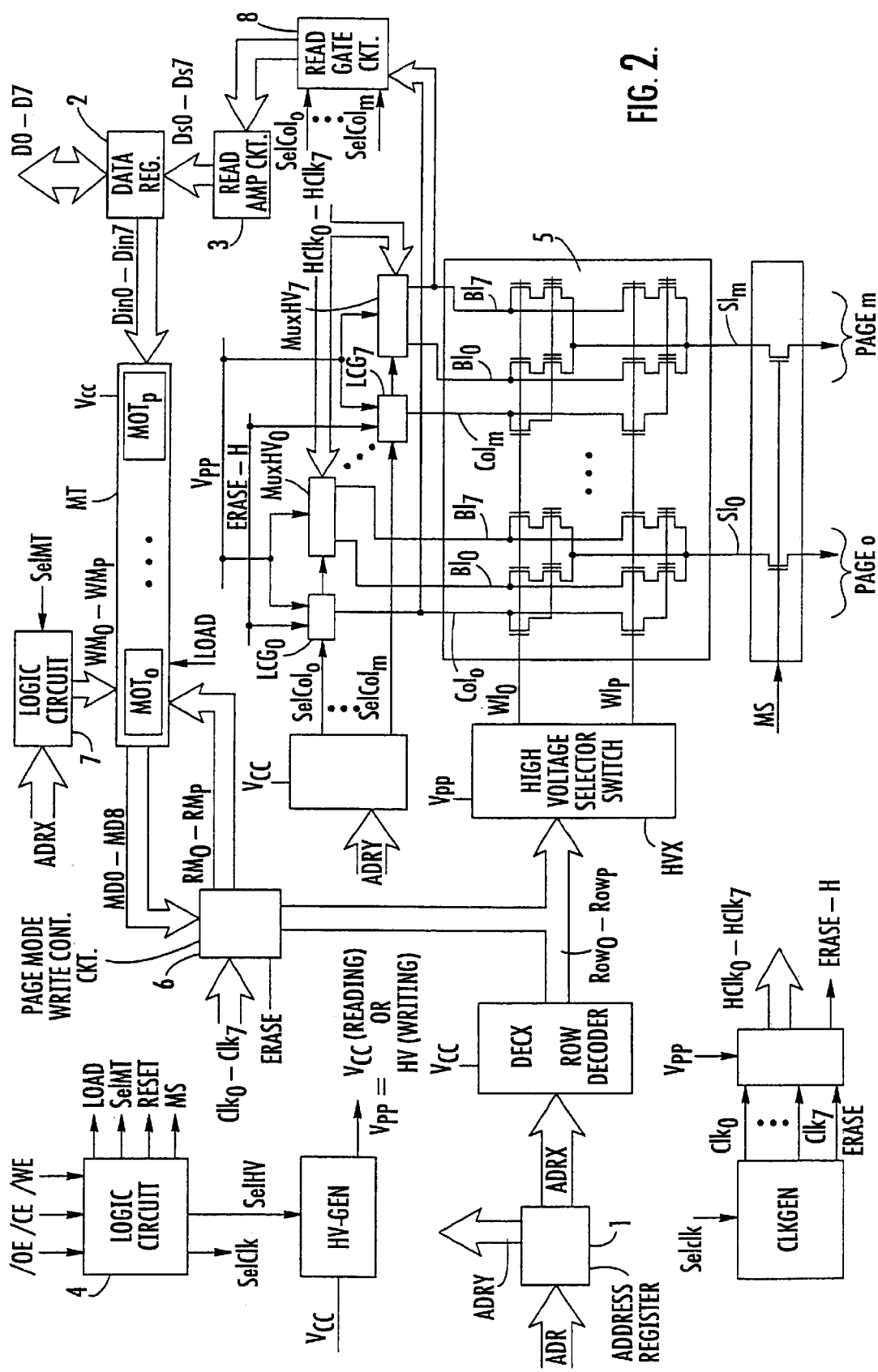
FIG. 2 shows a general block diagram of a memory circuit of a EEPROM type implementing page mode writing according to the present invention.

FIG. 2 shows an exemplary architecture of a memory circuit implementing a page mode write method according to the present invention. The example is that of a parallel access memory circuit. The present invention may also be applied equally well to a series access memory circuit. In FIG. 2, the elements common with FIG. 1 have the same references. In particular, the memory 5 is unchanged.

The page mode write method according to the present invention is used to manage the writing of one, or more, or all of the memory words of a column of the array of the memory. According to this method, a page corresponds to a column of the memory array. In the exemplary architecture shown in FIG. 2, there are thus m+1 pages corresponding to the m+1 columns Col0, ..., Colm of the memory array 5.

This reduces the number of high-voltage latches needed to erase and program the memory cells of the words of the page considered. This architecture enables the use of the high-voltage selector switch HVX associated with the row decoder DECX with a selective selection of the rows of the memory to be written as a function of the contents of the words in a temporary memory.

In one case, shown as a more specific example, for the writing of only certain words of the page, the words contained in a temporary memory each contain a bit relating to the position of the word in the page and information bits corresponding to the data element to be written.

In this context, the page mode write method according to the present invention erases all the memory cells of the rows for which the analysis of the contents of the temporary memory indicates an activated corresponding position bit. Among these rows, only the rows for which the analysis of the memory contents show a corresponding information bit at zero are programmed bit line by bit line.

If no provision is made for the possibility of writing only certain words of the page, the erasure of the column is done comprehensively for all the rows. In this case, there is no need to analyze the contents of the temporary memory. Thus, according to the write method of the present invention, the row decoder DECX is deselected for a circuit that analyses the contents of the temporary memory to provide the row selection signals at output.

A corresponding architecture thus comprises a temporary memory MT supplied with the logic power supply voltage Vcc of the circuit to contain the data to be written in the memory. A page mode write control circuit 6 for the non-volatile memory generates the row selection signals Row0–Rowp as a function of the contents of the temporary memory MT. One latch LCG0–LCGm per column Col0–Colm of the non-volatile memory array 5 stores a page selection information element.

The temporary memory MT may typically comprise bistable or latch type memory elements. Since a page according to the present invention corresponds to one column, this temporary memory MT comprises as many memory elements MOT0–MOTP as there are rows Wl0–Wlp of the non-volatile memory array. There are thus p+1 memory elements in the example.

In the page mode write initialization phase, this temporary memory MT receives the data to be written by the internal data input bus Di0–Di7. This is managed in the write mode by a logic circuit 7 which receives the address signals ADRX. The logic circuit 7 provides a write signal Load at output and write selection signals WM0–WMp, each of which enables the writing, at a corresponding position, of the information bits of the data presented at input Di0–Di7 and the positioning of a corresponding position bit. At the end of the resetting phase, and for each position address presented on the external address bus, the temporary memory contains the information bits of the corresponding data element presented on the external address bus, and an activated position information bit.

In the example, the bit MD0 corresponds to the position information POSBIT and the bits MD1–MD8 correspond to the information bits Databit0, . . . , Databit7 to be written in the non-volatile memory. The information bits are written on the corresponding bit lines Bl0, . . . , Bl7.

The position information bit is positioned by the corresponding write selection signal of the temporary memory. For example, in the memory word MOT0, it is positioned at 1 by the signal WM0 if a corresponding address has been received. This enables the writing of all or part of a page. The analysis of the position bit makes it possible to know whether the corresponding data element has to be taken into account. If this possibility of writing the page only in part does not have to be taken into account, then the entire logic system associated with the position bit is not needed.

A resetting signal Reset resets all the elements of the temporary memory. This signal is activated by the general control circuit 4 whenever the integrated circuit is powered on, and at each new page mode write operation.

The temporary memory MT receives read selection signals RM0–RM7 applied by the page mode write control circuit 6 enabling the selection and reading of the bits MD0–MD8 of a word of the temporary memory. These information bits are received by the page mode write control circuit 6 to analyze the contents of the temporary memory.

Figure 3:
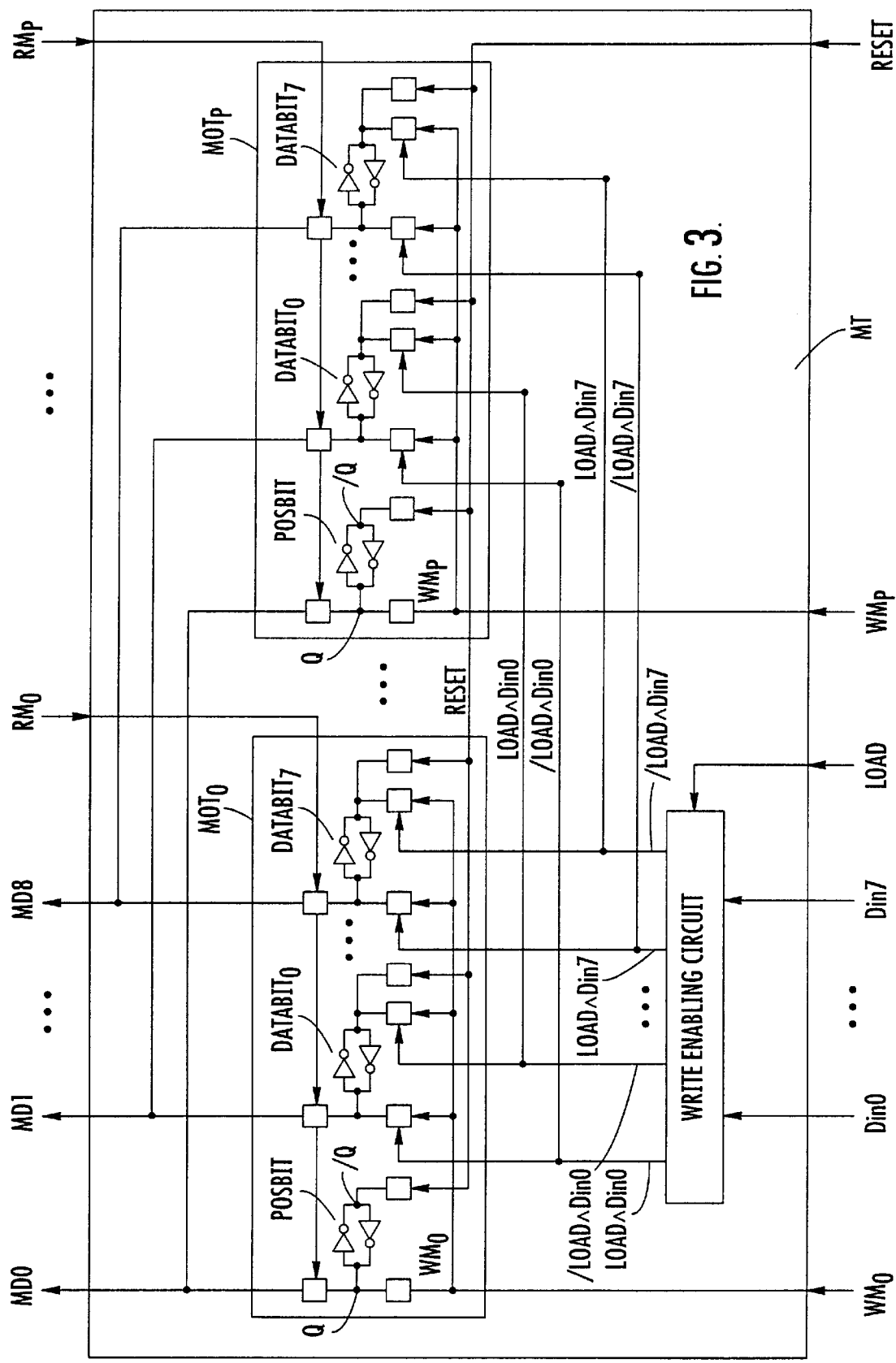
FIG. 3 is a more detailed block diagram of a memory according to the present invention.

An exemplary temporary memory MT is shown in detail in FIG. 3. It comprises p+1 memory elements MOT0 to MOTP. Each word in the example has 1+8 information bits. The first information bit is the information bit POSBIT of the word position in the page. The eight following bits databit0–databit7 correspond to the information bits to be written in the non-volatile memory.

Each bit is stored in a latch type (bistable) element with two input/output nodes Q and /Q. For the word position bit POSBIT, the one-setting or setting circuit connected to the node Q is controlled by the write selection signal of the corresponding word WM0 for the element Mot0. The resetting signal connected to the node /Q is controlled by the signal Reset. In the example, the read circuit is connected between the node Q and the corresponding data output line MD0, and controlled by the corresponding read selection signal RM0.

For the other information bits, there is a first setting circuit connected to the node Q and controlled by a signal Load.Din0, and a second setting circuit connected to the node /Q and controlled by the complementary signal /Load.Din0. The signals Load.Din0 and /Load.Din0 are given by an input data Din0, . . . , Din7 write enabling circuit. This circuit receives the input data and the write enable signal Load and, in the example, carries out a logic AND operation between each of the data bits and the enabling signal to provide, for each of the latches, the write signal. An inverter gives the complementary signal.

A resetting circuit on the node /Q and a read circuit on the node Q are also provided. These circuits are identical to those of the position bit. The output data MD0 to MD8 thus corresponds to the information bits Databit0 to Databit7 of the temporary memory.

The page mode write control circuit 6 receives as inputs the phase signals Clk0–Clk7 as well as the output data bits MD0–MD8 of the temporary memory. They manage the read access by generating the read selection signals RM0–RM7. At output, the page mode write control circuit 6 provides the row selection signals Row0–Rowp of the non-volatile memory as a function of the contents of the temporary memory. This circuit will be described in detail further below.

The page mode write means includes, for each column, a latch (register) Lcg0, . . . , Lcgm to store page selection information, and a high-voltage multiplexer circuit muxhv0, . . . , muxhvm. The high-voltage multiplexer circuit enables the successive application of the high voltage to each of the bit lines Bl0–Bl7 of the corresponding column according to the sequencing of the high-voltage phase signals hclk0–hclk7 during the programming phase bit line by bit line. These elements are described in detail in FIG. 4.

Figure 5:
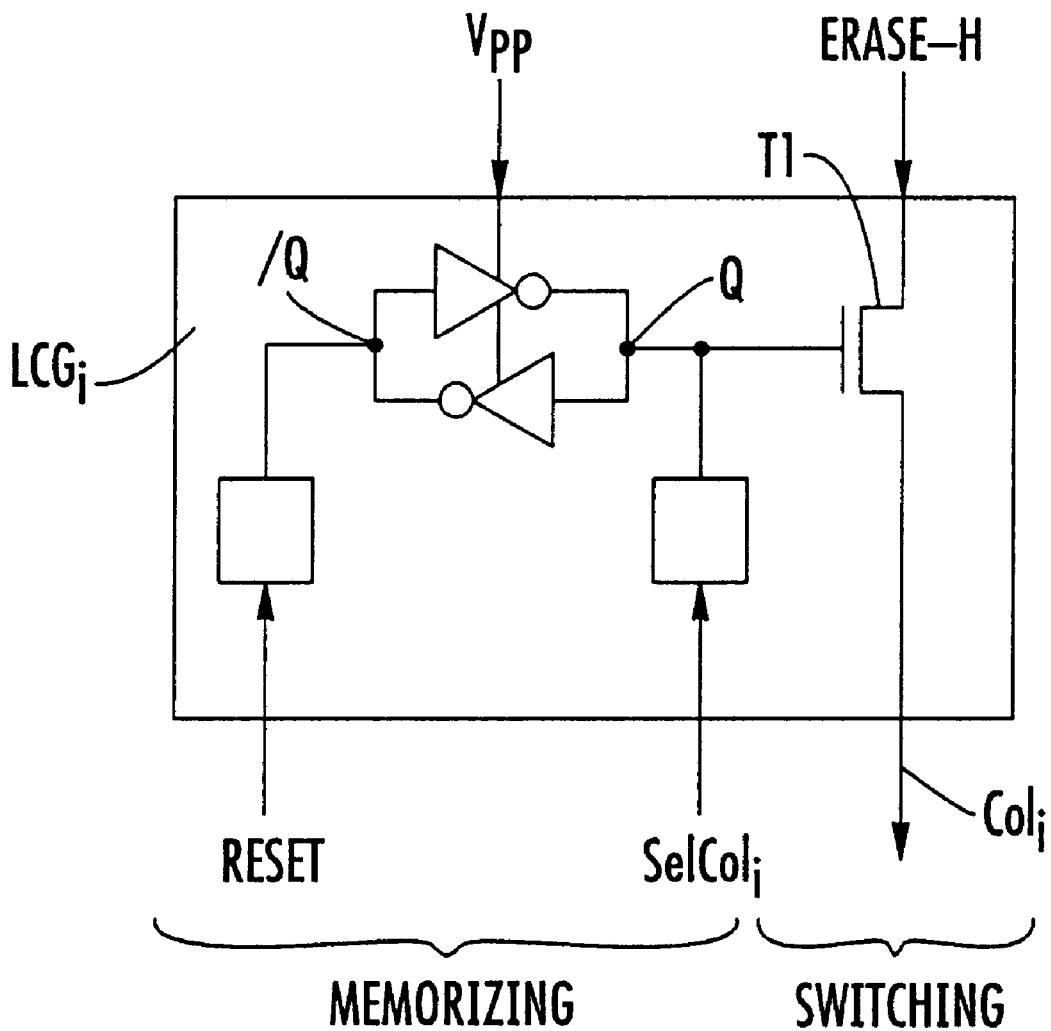
FIG. 5 is a detailed block diagram of a high-voltage latch according to the present invention.

Each high-voltage multiplexer Muxhv0, . . . , Muxhvm comprises one high-voltage selection switch transistor per bit line Bl0, ..., Bl7 controlled by a corresponding high-voltage phase signal hclk0, ..., Hclk7. The page selection storage latches are also high-voltage latches. There is one page selection storage latch per column. As described in detail in FIG. 5, each latch Cghvi comprises a bistable type storage stage powered at high voltage Vpp. The setting circuit is controlled by the corresponding column selection signal SelColi given by the column decoder DECY of the non-volatile memory. The resetting circuit connected to the input/output node /Q is controlled by the resetting signal Reset.

Each latch furthermore comprises a selector switch stage for the application of the high voltage on the corresponding column. In the example, this selector switch stage comprises a transistor T1 to switch over the level of a high-voltage erase control signal erase-H to the corresponding column. The transistor T1 is controlled at its gate by the output Q of the bistable circuit corresponding to the setting.

Figure 8:
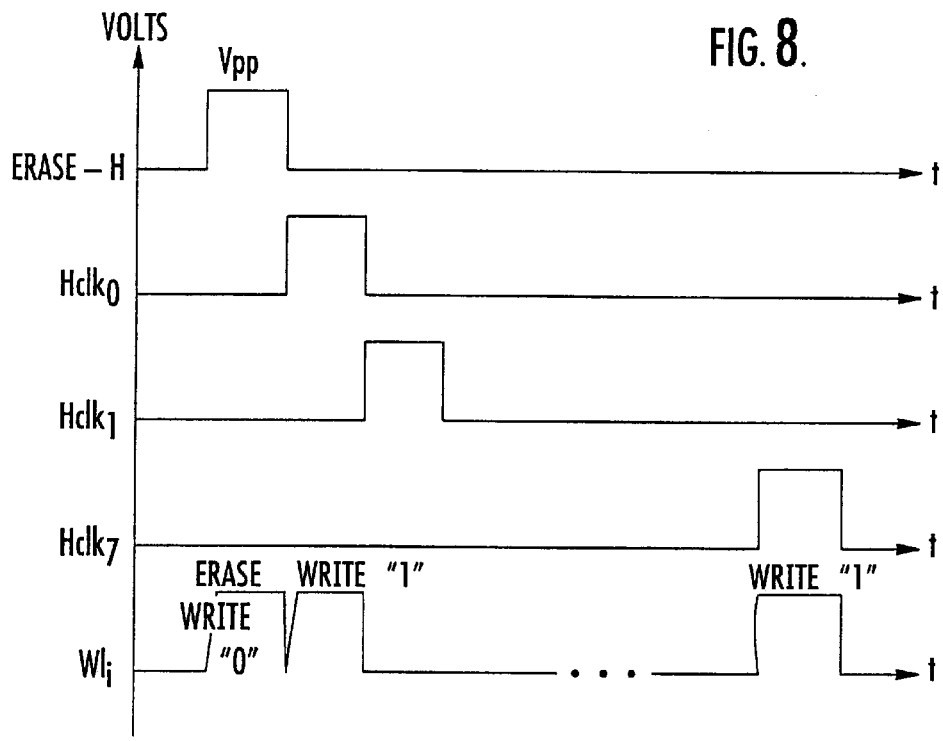
FIG. 8 is a timing diagram of erase and programming phases in page mode according to the present invention.

This high-voltage erase control signal erase-H is typically provided by an erase control logic signal generated by the clock generation circuit CLKGEN. In the example, this signal is at the level 1 (Vpp) during the erase phase. The signal then goes to 0 during the programming phase as shown in FIG. 8.

Figure 4:
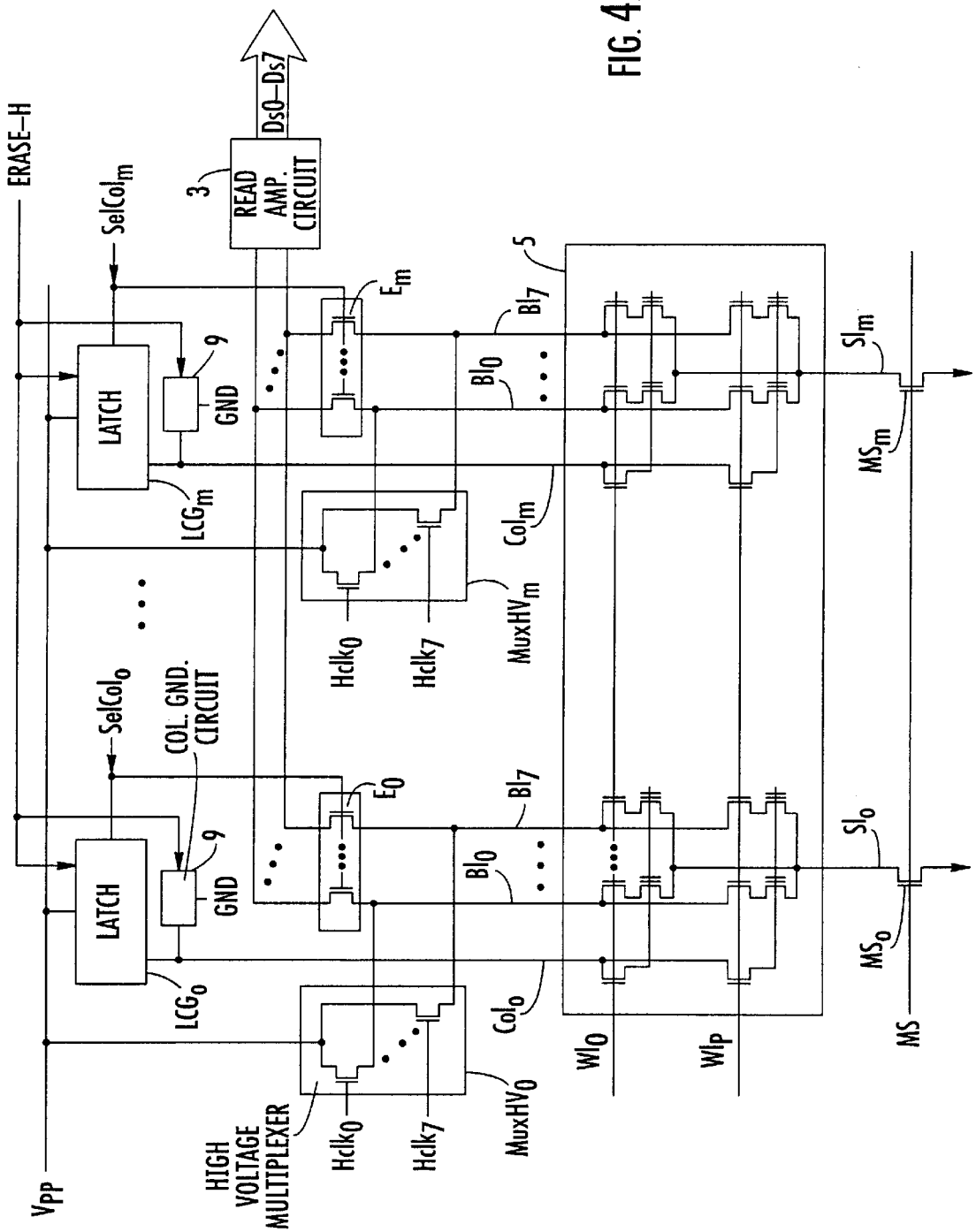
FIG. 4 shows the latches and high-voltage selector switch circuits used in page mode in the memory circuit according to the present invention.
Figure 9A:
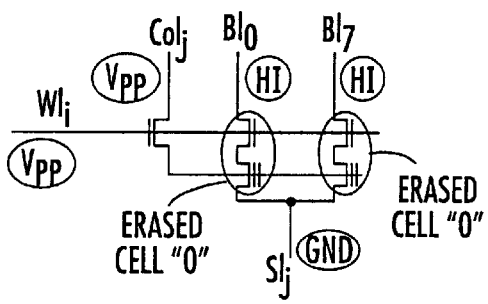
FIGS. 9a and 9b are simplified diagrams indicating respective biasing voltages applied to the memory cells in erase and programming phases.
Figure 9B:
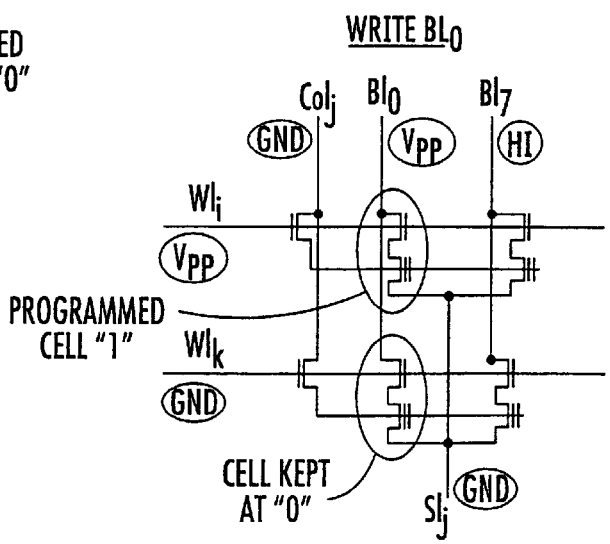

FIG. 4 furthermore shows a column grounding circuit 9 driven by the signal erase-H. In the example, it comprises one transistor per column connected between this column and the ground Gnd of the circuit, and is activated on the level 0 of the control signal erase-H. Thus, the columns of the non-volatile memory array are all pulled down to ground during the programming phase. This is also illustrated with respect to the timing diagram (FIG. 8) for sequencing of the signals, and in the discussion of the levels applied to the non-volatile memory cells (FIGS. 9a, 9b).

The read gate circuit 8 that enables the connection of the bit lines of a column to the read amplifier circuit 3 is described in detail in FIG. 4. It comprises one stage per column, m+1 stages E0 to Em. Each stage is associated with a corresponding column to connect the bit lines Bl0–Bl7 of this column to the read amplifiers of the data output circuit 3 according to the corresponding column selection signal.

Figure 6:
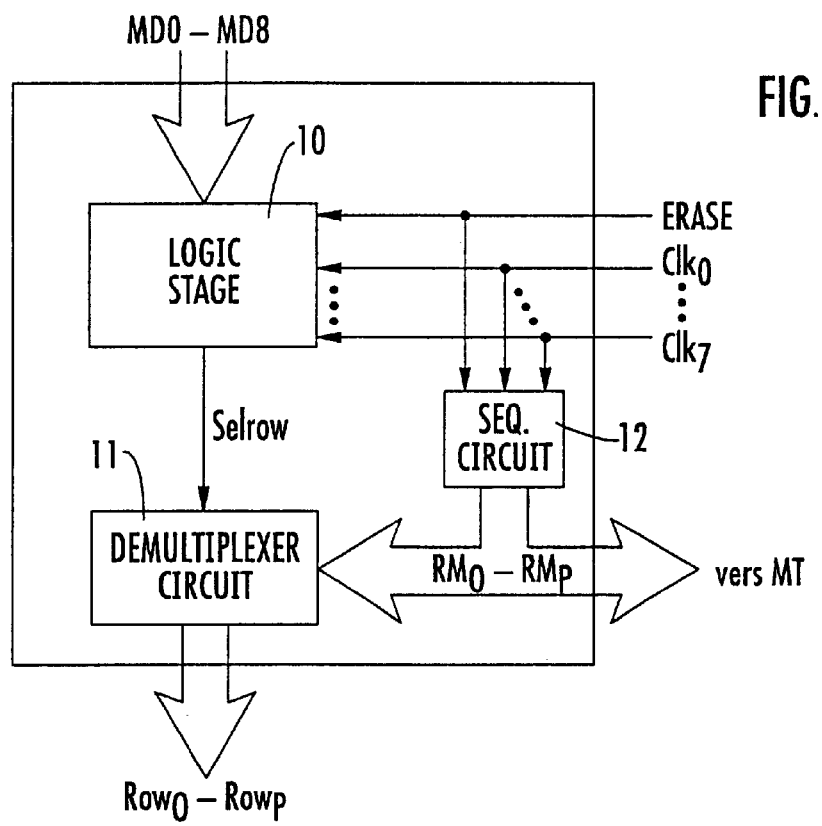
FIG. 6 is a block diagram of the page mode write control circuit according to the present invention.
Figure 7:
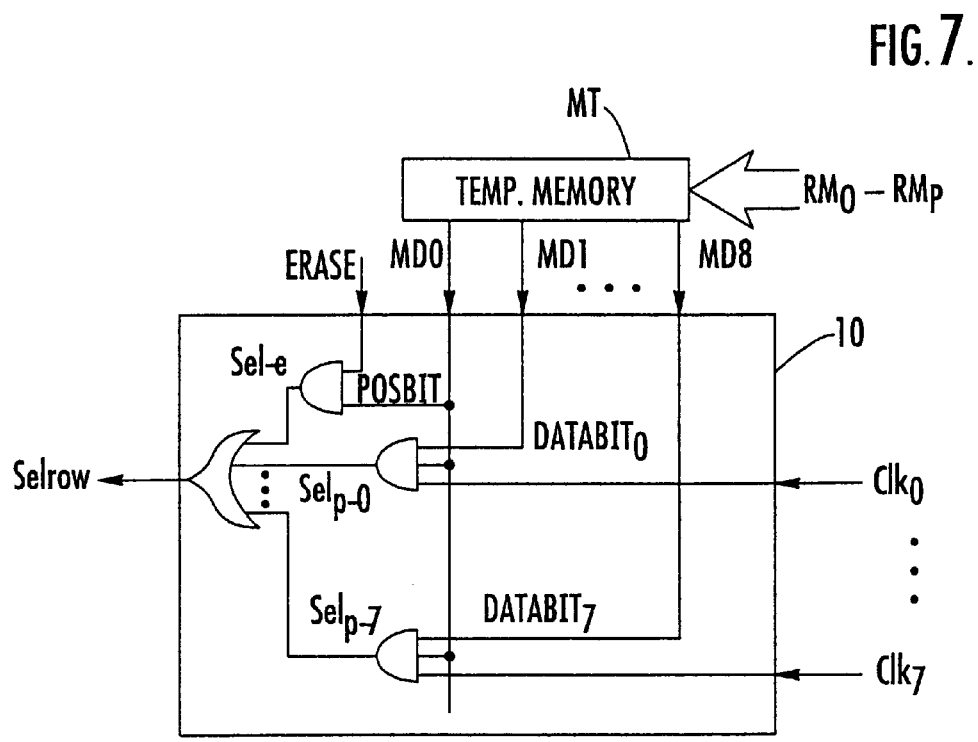
FIG. 7 is a detailed block diagram of the circuit for the generation of row selection signals of the memory array by the control circuit of FIG. 6.

The page mode write control circuit 6 is described in detail in FIG. 6 which shows a general block diagram, and in FIG. 7 which shows a detail of the structure of the logic stage for the analysis of the contents of the temporary memory. The page mode write control circuit 6 comprises a logic stage 10, a demultiplexer circuit 11 and a sequencing circuit 12.

At input, the logic stage receives the output data MD0 to MD8 from the temporary memory, the phasing logic signals Clk0 to Clk7, and the erasure control logic signal erase. This logic stage delivers a row selection information element Selrow at output. This row selection information element is applied at input to a demultiplexer circuit 11. The demultiplexer circuit 11 switches over this information at output to one of the row selection signals Row0 to Rowp as a function of the read selection signals RM0 to RMp applied to the sequencing circuit 12 on the temporary memory MT.

The sequencing circuit 12 may typically be a counter of 0 to p. It is activated by the erase control logic signal and phasing logic signals Clk0 to clk7. Whether it is for the erasure step or for each of the programming steps, it is necessary each time to analyze all the contents of the non-volatile memory for the selective selection of the rows. Thus, for each of these steps, it is necessary to successively regenerate the read selection signals RM0 to RMp of the temporary memory for the sequential reading of the data contained in the temporary memory. For each data, it is necessary to decide in the logic stage 10 on the selection or non-selection of the row corresponding to the word read in the temporary memory for the phase considered.

If the erasure control logic signal erase and the phase signals Clk0 to Clk7 are considered to be all active at the level 1, it is sufficient to form a logic OR of all these signals to reset the counter at each phase. An exemplary embodiment of the logic stage is shown in FIG. 7. In this example, the position information bits are validated at 1. An information bit at 1 corresponds to a data element to be programmed (writing of a 1), and an information bit at 0 correspond to a data element to be erased (writing of a 0).

In the erase phase, it is necessary to identify the rows in which there is a word to be written. The contents of the word to be written are not critical. Once they are erased, a look shall be taken at the bits to be written at 1 to program only those bits, and the others will remain erased (written at 0). In this phase sequenced by the erase logic control signal erase, it is therefore necessary only to look at the position bit of each word to select the rows for which the position bit of the word of corresponding rank in the temporary memory will have been positioned at 1. In each of the programming phases Clk0 to Clk7, it is necessary to look, in each word of the temporary memory, at the state of the information bit of the same rank as the bit line considered to select the rows for which this bit is read at 1.

This selection logic may be obtained relatively straightforward using combinational logic gates. For each decision level, there is an AND logic gate. A first gate receives the bit MD0 corresponding to the position bit POSBIT and the erasure control logic signal erase and provides, at output, a decision signal Sel-e with a level 1 if the system is in erase phase (erase at 1) and if the bit is positioned. A second logic gate receives the bit MD1 corresponding to the information bit Databit0, the bit MD0 corresponding to the position bit POSBIT, and the phasing logic signal Clk0. It provides at output a decision signal Sel-p0 at level 1 if the system is in the phase of programming the line Bl0 (Clk0 at 1), if the position bit is positioned indicating that the information bits are valid, and if the information bit is itself at 1, indicating that a programming operation is needed.

The other logic gates for the other data bits MD2 to MD8 are identical to this second gate and are controlled by the corresponding phasing logic signal Clk1 to Clk7. Hence nine output signals Sel-e, Sel-p0, ..., Sel-p7 are obtained. These signals are all active at 1. In the example, they are combined in a logic OR gate to provide the row selection information Selrow at output. If the system is in the sequence of reading the first word Moti of the temporary memory controlled by the read selection signal RMi, the demultiplexer 12 then applies the information Selrow to the corresponding row selection signal Rowi.

The sequencing of a page mode write operation according to the invention is shown in FIG. 8. The levels applied to a memory cell in erasure and programming modes are indicated in FIGS. 9a and 9b. During the erase phase (FIG. 9a), a row Wli selected by the control circuit 6 receives the high voltage Vpp. The selected column, Col0 for example in FIG. 9a, also receives the high voltage through the page selection latch positioned at 1. Since the other latches are always at 0, the other columns are in a state of high impedance HI. Thus, only the words of the selected column corresponding to the selected rows are erased.

At the end of the erase phase, the signal erase-H goes to zero, and the programming phase starts. The columns are drawn to ground (Gnd) by the circuit 9. The programming phase comprises eight programming stages, one per bit line, and each sequenced by a corresponding phasing logic signal.

During the step for programming the first bit line Bl0, the bit lines Bl0 of the memory array receive the high voltage Vpp and the other bit lines are in a state of high impedance. These levels are imposed by the multiplexers muxhvo to muxhvm sequenced by the high-voltage phase signals hclk0 to hclk7. A row Wli selected in programming mode in this step by the control circuit 6 receives the high voltage Vpp, while a row Wlk which is non-selected in programming in this step by the control circuit 6 is ground connected. This continues for each of the eight programming steps. FIG. 8 thus shows that the signal Wli is at Vpp in erasure phase (erase at 1). Then it is at times at Vpp and at times at 0 depending on whether a 1 or 0 has to be written therein.

The invention that has just been described enables the reduction of the number of high-voltage elements needed for page mode writing. It comprises no more than m+1 high-voltage latches and m+1 high-voltage multiplexers. The control logic circuit 6 enables the use of the high-voltage row selector switch HVX. The page mode access time is slightly increased due to the sequencing needed for the analysis of the static memory, but remains quite satisfactory, which is in the range of 10 ms.

The architecture described more particularly is only an illustrative example of the invention. Other architectures are possible. Variations of the write method are also possible. In particular, it may be planned in the initialization phase to write the contents of the non-volatile memory column selected in page mode into the temporary memory. The data presented for page mode writing is used to modify the contents of the temporary memory. In this case, the column will be totally erased, and this will be followed by a selective programming according to the principle of the present invention. It is also possible not to permit the writing of only one part of the memory. In this case, the erase will also be a total erasure. All these variations remain within the scope of the present invention.

That which is claimed is:

1. A method for writing in page mode in an electrically erasable and programmable non-volatile memory comprising a plurality of memory cells forming a memory array organized in columns and rows of memory words, a group of bit lines connected to the memory array, a row decoder and a column decoder respectively connected to the memory array for providing row selection signals and column selection signals enabling read access and write access to the memory array, and a page mode write circuit comprising a temporary memory for storing data to be written in the page, the method comprising:

selecting a column of the memory array as the page to be written.

2. A method according to claim 1, further comprising:

an initialization phase comprising writing a page selection information element in a storage latch in the temporary memory associated with the selected column, and writing in the temporary memory the data to be written in the page; and a write phase comprising writing contents of the temporary memory in the page.

3. A method according to claim 2, wherein the temporary memory comprises one storage latch per column of the memory array for storing the page selection information element.

4. A method according to claim 2, wherein the temporary memory comprises only one storage latch per column of the memory array for storing the page selection information element.

5. A method according to claim 3, wherein the initialization phase further comprises receiving a column address at an input of the column decoder, and providing a corresponding column selection signal at an output for activating writing of the page selection information element in the corresponding latch.

6. A method according to claim 2, wherein the write phase comprises an erase phase and a programming phase; the programming phase being performed on the selected column one bit line at a time, and programming a bit line comprising generating row selection signals based upon a corresponding page selection information element in each word stored in the temporary memory.

7. A method according to claim 6, wherein each word in the temporary memory comprises information bits corresponding to the data to be written, and a position information bit relating to a position of the word in the page.

8. A method according to claim 7, wherein the erase phase comprises generating the row selection signals for programming a bit line based upon the position information bits stored in the temporary memory.

9. A method according to claim 6, wherein the erase phase comprises applying a voltage to the selected column based upon the page selection information stored in a page selection latch.

10. A method for writing in page mode in a memory comprising a plurality of memory cells forming a memory array organized in columns and rows of memory words, and a page mode write circuit comprising a temporary memory for storing data to be written in the page, the method comprising:

selecting a column of the memory array as the page to be written.

11. A method according to claim 10, further comprising:

an initialization phase comprising writing a page selection information element in the temporary memory associated with the selected column; and a write phase comprising writing contents of the temporary memory in the page.

12. A method according to claim 11, wherein the initialization phase further comprises writing in the temporary memory the data to be written in the page.

13. A method according to claim 11, wherein the temporary memory comprises one storage latch per column; and wherein the initialization phase comprising writing comprises writing the page selection information element in one of the storage latches.

14. A method according to claim 11, wherein the temporary memory comprises only one storage latch per column; and wherein the initialization phase comprising writing comprises writing the page selection information element in one of the storage latches.

15. A method according to claim 13, wherein the initialization phase further comprises receiving a column address at an input of a column decoder, and providing a corresponding column selection signal at an output for activating writing of the page selection information element in the corresponding latch.

16. A method according to claim 11, wherein the write phase comprises an erase phase and a programming phase; the programming phase being performed on the selected column one bit line at a time, and programming a bit line comprising generating row selection signals based upon a corresponding page selection information element in each word stored in the temporary memory.

17. A method according to claim 16, wherein each word in the temporary memory comprises information bits corresponding to the data to be written, and a position information bit relating to a position of the word in the page.

18. A method according to claim 17, wherein the erase phase comprises generating the row selection signals for programming a bit line based upon the position information bits stored in the temporary memory.

19. A method according to claim 16, wherein the erase phase comprises applying a voltage to the selected column based upon the page selection information stored in a page selection latch.

20. A method according to claim 11, wherein the plurality of memory cells form an electrically erasable and programmable non-volatile memory.

21. A memory comprising:
a plurality of memory cells forming a memory array organized in columns and rows of memory words;
a group of bit lines connected to said memory array;
a row decoder connected to said memory array for providing row selection signals;
a column decoder connected to said memory array for providing column selection signals; and
a page write circuit for writing a page during a page mode of operation, said page write circuit comprising a temporary memory for storing data to be written in the page, the page corresponding to a selected column of said memory array.

22. A memory according to claim 21, wherein said temporary memory stores a page selection information element and data to be written in the page, said temporary memory storing the page selection information element in a storage latch associated with the selected column, the memory further comprising a control logic circuit cooperating with said row decoder for providing row selection signals during a write phase for writing the selected column of said memory array as a function of the contents of said temporary memory.

23. A memory according to claim 22, wherein said temporary memory comprises only one storage latch per column.

24. A memory according to claim 22, wherein each storage latch is controlled in a write phase by a corresponding column selection signal, the page selection information element stored enables application of a voltage in an erase phase only to the selected column corresponding to the page.

25. A memory according to claim 22, wherein said control logic circuit successively provides the row selection signals one bit line at a time based upon a corresponding information bit in each word of the temporary memory for enabling selective programming of the rows of said memory array.

26. A memory according to claim 22, wherein each word in the temporary memory comprises information bits corresponding to the data to be written and a position information bit on the position of the word; and
said control logic circuit being activated by an erase logic control signal for providing row selection signals corresponding to the position information bits stored in said temporary memory for the selective erasure of the rows of said memory array.

27. A memory according to claim 26, wherein said control logic circuit selectively provides the row selection signals one bit line at a time for selectively programming rows based upon the position information bit of each of the words of the temporary memory.

28. A memory according to claim 21, further comprising:
a selection switch circuit for switching a high voltage to said group of bit lines; and
a circuit for providing a phasing logic signal and a corresponding high voltage phase signal to sequence programming of each bit line, these signals being respectively applied to said control logic circuit and to said selection switch circuit for the switching of the high voltage to said group of bit lines.

29. A memory according to claim 21, wherein the plurality of memory cells form an electrically erasable and programmable non-volatile memory.

* * * * *